(12) United States Patent
Frayer

(10) Patent No.: US 6,807,610 B2
(45) Date of Patent: Oct. 19, 2004

(54) METHOD AND APPARATUS FOR VIRTUALLY PARTITIONING AN INTEGRATED MULTILEVEL NONVOLATILE MEMORY CIRCUIT

(75) Inventor: Jack E. Frayer, Boulder Creek, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 12 days.

(21) Appl. No.: 10/286,605
(22) Filed: Nov. 1, 2002

(65) Prior Publication Data
US 2004/0088502 A1 May 6, 2004

(51) Int. Cl.⁷ .............................................. G06F 12/00
(52) U.S. Cl. ........................ 711/156; 711/103; 711/156; 365/185.03
(58) Field of Search ................................ 711/103, 156; 365/185.03

(56) References Cited

U.S. PATENT DOCUMENTS 5,602,987 A    2/1997   Harari et al. .................. 714/8
5,909,449 A *  6/1999   So et al. ...................... 714/721

* cited by examiner

Primary Examiner—Mano Padmanabhan
Assistant Examiner—Mehdi Namazi
(74) Attorney, Agent, or Firm—Gray Cary Ware & Freidenrich LLP (57) ABSTRACT

An integrated multilevel nonvolatile flash memory device has a memory array of a plurality of memory units arranged in a plurality of rows and columns. Each of the memory units has a plurality of memory cells with each memory cell for storing a multibit state. Each of the memory units stores encoded user data and overhead data. The partitioning of the encoded user data and the overhead data stored in a single memory unit may be done virtually. The result is a compact memory unit without the need for an index to overhead data for its associated user data.

11 Claims, 6 Drawing Sheets

| CELL1 LEVELS | CELL2 LEVELS | DATA STATES | DATA D BITS | DATA OVERHEAD EX STATES | DATA OVERHEAD EX BITS | EXT MLC | DATA MLC |
|---|---|---|---|---|---|---|---|
| 6  | 6  | 36  | 5 | 4  | 2 | 1X | 2.5X |
| 12 | 12 | 144 | 7 | 16 | 4 | 2X | 3.5X |
| 18 | 18 | 324 | 8 | 68 | 6 | 3X | 4X   |
| 24 | 24 | 576 | 9 | 64 | 6 | 3X | 4.5X |

12 LEVELS/CELL 44

| LEVEL | X 46<br>CELL1 | Y 48<br>CELL2 |
|---|---|---|
| 1 | | |
| 2 | | |
| 3 | | |
| 4 | | |
| 5 | | |
| 6 | | |
| 7 | | |
| 8 | | |
| 9 | | |
| 10 | | |
| 11 | | |
| 12 | | |

FIG. 4

CELL 2

| | 1 | 2 | 3 | 4 | 5 | 6 | 7 | 8 | 9 | 10 | 11 | 12 |
|---|---|---|---|---|---|---|---|---|---|---|---|---|
| 1 | 1 | | | | | | | | | | 121 | 5 |
| 2 | 2 | | | | | | | | | | 122 | 6 |
| 3 | 3 | | | | | | | | | | 123 | 7 |
| 4 | 4 | | | | | | | | | | 124 | 8 |
| 5 | | | | | | | | | | | 125 | 9 |
| 6 | | | | | | | | | | | 126 | 10 |
| 7 | | | | | | | | | | | 127 | 11 |
| 8 | | | | | | | | | | | 128 | 12 |
| 9 | | | | | | | | | | | 1 | 13 |
| 10 | | | | | | | | | | | 2 | 14 |
| 11 | | | | | | | | | | | 3 | 15 |
| 12 | | | | | | | | | | | 4 | 16 |

CELL 1

7 BITS     4 BITS

CELL 2

| X \ Y | 0000000 | 0001100 | 0011000 | 0100100 | 0110000 | 0111100 | 1001000 | 1010100 | 1100000 | 1101100 | 1111000 | 10000100 |
|---|---|---|---|---|---|---|---|---|---|---|---|---|
| | | 1 | 2 | 3 | 4 | 5 | 6 | 7 | 8 | 9 | 10 | 11 | 12 |
| 0000 | 1 | 0 | 12 | 24 | 36 | 48 | 60 | 72 | 84 | 96 | 108 | 120 | E4 |
| 0001 | 2 | 1 | 13 | 25 | 37 | 49 | 61 | 73 | 85 | 97 | 109 | 121 | E5 |
| 0010 | 3 | 2 | 14 | 26 | 38 | 50 | 62 | 74 | 86 | 98 | 110 | 122 | E6 |
| 0011 | 4 | 3 | 15 | 27 | 39 | 51 | 63 | 75 | 87 | 99 | 111 | 123 | E7 |
| 0100 | 5 | 4 | 16 | 28 | 40 | 52 | 64 | 76 | 88 | 100 | 112 | 124 | E8 |
| 0101 | 6 | 5 | 17 | 29 | 41 | 53 | 65 | 77 | 89 | 101 | 113 | 125 | E9 |
| 0110 | 7 | 6 | 18 | 30 | 42 | 54 | 66 | 78 | 90 | 102 | 114 | 126 | E10 |
| 0111 | 8 | 7 | 19 | 31 | 43 | 55 | 67 | 79 | 91 | 103 | 115 | 127 | E11 |
| 1000 | 9 | 8 | 20 | 32 | 44 | 56 | 68 | 80 | 92 | 104 | 116 | E0 | E12 |
| 1001 | 10 | 9 | 21 | 33 | 45 | 57 | 69 | 81 | 93 | 105 | 117 | E1 | E13 |
| 1010 | 11 | 10 | 22 | 34 | 46 | 58 | 70 | 82 | 94 | 106 | 118 | E2 | E14 |
| 1011 | 12 | 11 | 23 | 35 | 47 | 59 | 71 | 83 | 95 | 107 | 119 | E3 | E15 |

CELL 1 — 7 BITS
4 BITS

X + Y = DATA IF NO CARRY (ALL 7 BITS)
X + Y = EXTENSION IF BIT 8 = 1 (USE ONLY 4 LOWER BITS)

FIG. 7

| X = 5 | Y = 3 | 0110000+0010=> | 0110010 | => 2+16+32 | 50 | DATA |
|---|---|---|---|---|---|---|
| X = 11 | Y = 9 | 1111000+1000=> | 1 00000000 | 0 | 0 | EXTENSION |

FIG. 8

| EXAMPLES | | EXTENSION | DATA | ALL EXTENSION |
|---|---|---|---|---|
| ALL DATA | | 320 CELLS | 4688 CELLS | 5008 CELLS |
| 5008 CELLS | | 80 BYTES | 2051 BYTES | 1252 BYTES |
| 2191 DATA BYTES | | | | |

5008 CELLS

FIG. 9

(Figure 9 shows a bit-packing diagram with 16 CELLS, 7 BYTES DATA OR 4 BYTES EXTENSION, labeled DATA at 3.5X and EXTENSION at 2X, with 8 BITS columns containing CELL1/CELL2 bit allocations.)

| X \ Y | | 0000000 | 0001100 | 0011000 | 0100100 | 0110000 | 0111100 | 1001000 | 1010100 | 1100000 | 1101100 | 1111000 | 10000100 |
|---|---|---|---|---|---|---|---|---|---|---|---|---|
| 0000 | 1 | 0 | 12 | 24 | 36 | 48 | 60 | 72 | 84 | 96 | 104 | 112 | 120 |
| 0001 | 2 | 1 | 13 | 25 | 37 | 49 | 61 | 73 | 85 | 97 | 105 | 113 | 121 |
| 0010 | 3 | 2 | 14 | 26 | 38 | 50 | 62 | 74 | 86 | 98 | 106 | 114 | 122 |
| 0011 | 4 | 3 | 15 | 27 | 39 | 51 | 63 | 75 | 87 | 99 | 107 | 115 | 123 |
| 0100 | 5 | 4 | 16 | 28 | 40 | 52 | 64 | 76 | 88 | 100 | 108 | 116 | 124 |
| 0101 | 6 | 5 | 17 | 29 | 41 | 53 | 65 | 77 | 89 | 101 | 109 | 117 | 125 |
| 0110 | 7 | 6 | 18 | 30 | 42 | 54 | 66 | 78 | 90 | 102 | 110 | 118 | 126 |
| 0111 | 8 | 7 | 19 | 31 | 43 | 55 | 67 | 79 | 91 | 103 | 111 | 119 | 127 |
| 1000 | 9 | 8 | 20 | 32 | 44 | 56 | 68 | 80 | 92 | E0 | E4 | E8 | E12 |
| 1001 | 10 | 9 | 21 | 33 | 45 | 57 | 69 | 81 | 93 | E1 | E5 | E9 | E13 |
| 1010 | 11 | 10 | 22 | 34 | 46 | 58 | 70 | 82 | 94 | E2 | E6 | E10 | E14 |
| 1011 | 12 | 11 | 23 | 35 | 47 | 59 | 71 | 83 | 95 | E3 | E7 | E11 | E15 |

CELL 1 / CELL 2

| CELL1 | CELL2 | DATA | | DATA OVERHEAD | | DATA OVERHEAD | DATA |
|---|---|---|---|---|---|---|---|
| LEVELS | LEVELS | STATES | D BITS | EX STATES | EX BITS | EXT MLC | DATA MLC |
| 6 | 6 | 36 | 5 | 4 | 2 | 1X | 2.5X |
| 12 | 12 | 144 | 7 | 16 | 4 | 2X | 3.5X |
| 18 | 18 | 324 | 8 | 68 | 6 | 3X | 4X |
| 24 | 24 | 576 | 9 | 64 | 6 | 3X | 4.5X |

METHOD AND APPARATUS FOR VIRTUALLY PARTITIONING AN INTEGRATED MULTILEVEL NONVOLATILE MEMORY CIRCUIT

TECHNICAL FIELD

The present invention relates to an integrated multilevel nonvolatile memory circuit which has a plurality of memory units arranged in an array comprising a plurality of rows and columns, wherein each of the memory units has a plurality of memory cells with each cell for storing a multibit state and wherein the memory units store encoded user data and overhead data. As a result, in the present invention, the encoded user data and the overhead data are partitioned virtually.

BACKGROUND OF THE INVENTION

Integrated nonvolatile memory array devices such as flash memory array devices are well known in the art. Typically, the memory array is arranged in a plurality of rows and columns. Further, a sector is a row or a plurality of rows. All the cells within a sector can be erased simultaneously. Within a sector, however, a number of the memory cells are reserved for storage of user data and a number of other memory cells are used to store overhead data such as error correction data, header, etc. See, for example, U.S. Pat. No. 5,602,987. Thus, in the prior art, the partitioning in an array of nonvolatile memory cells between a user data portion and an overhead data portion is based upon the physical boundaries of certain memory cells. In addition, an index is required to indicate where the boundaries of the memory cells are for storage of the user data and for the storage of the overhead data.

An integrated nonvolatile memory circuit array, such as a flash memory array for the storage of multilevels within a single cell is also well known in the art.

However, heretofore, none of the prior art teaches the virtual partitioning between user data and overhead data in an integrated multilevel nonvolatile memory array device whereby the virtual partitioning between the user data and the overhead data causes an increase in density of storage. In addition, the virtual partitioning obviates the need for an index detailing the boundaries of the cells to store user data and overhead data.

SUMMARY OF THE INVENTION

An integrated multilevel nonvolatile memory circuit has a plurality of memory units arranged in an array comprising a plurality of rows and columns. Each of the memory units has a plurality of memory cells with each cell for storing a multibit state. Each of the memory units stores encoded user data and overhead data.

The present invention also relates to a method for storing user data and overhead data in a nonvolatile memory circuit which comprises partitioning an array of semiconductive memory cells into a plurality of memory units with each memory unit having a plurality of memory cells. A multibit state is stored in each memory cell of each memory unit where the memory unit stores encoded user data and overhead data.

DETAILED DESCRIPTION OF THE INVENTION

Figure 1:
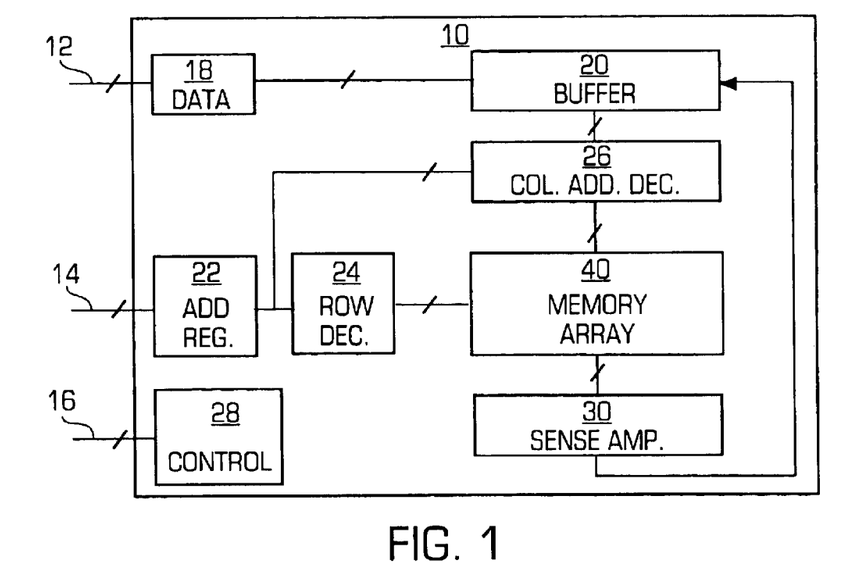
FIG. 1 is a schematic block level diagram of an integrated multilevel nonvolatile memory circuit of the present invention.

Referring to FIG. 1, there is shown a schematic diagram of an integrated multilevel nonvolatile memory device 10 of the present invention. The device 10 can be a flash memory device or an EEPROM device or any other type of technology in which a memory cell has the capacity to store a multilevel state. The device 10 is adapted to receive and to communicate externally along a data bus 12, an address bus 14, and a control bus 16. The device 10 comprises a data register 18 to receive data from the address bus 12 or to provide data to the address bus 12. The device 10 further has an address register 22 to receive addresses from the address bus 14. Finally, the device 10 comprises a control circuit 28 to receive signals from the control bus 16. The data register 18 is communicatively connected to a buffer 20. The address register 22 is communicatively connected to a row address decoder 24 and a column address decoder 26. The outputs of the column address decoder 26 and of the row address decoder 24 are supplied to a memory array 40. The memory array 40 is also connected to a sense amplifier 30 which is then connected to the buffer 20. The control circuit 28 supplies the necessary control signals including high voltage pump signals and the like for programming and erasure of memory cells in the memory array 40 in the event the memory array 40 comprises memory cells of the floating gate type. The general architecture of the device 10 as described hereinabove is well known in the art.

The memory array 40 as previously discussed comprises a plurality of memory units arranged in a plurality of rows and columns and with each memory unit having a plurality of memory cells. Each of the memory cells can store a multibit state.

Figure 2:
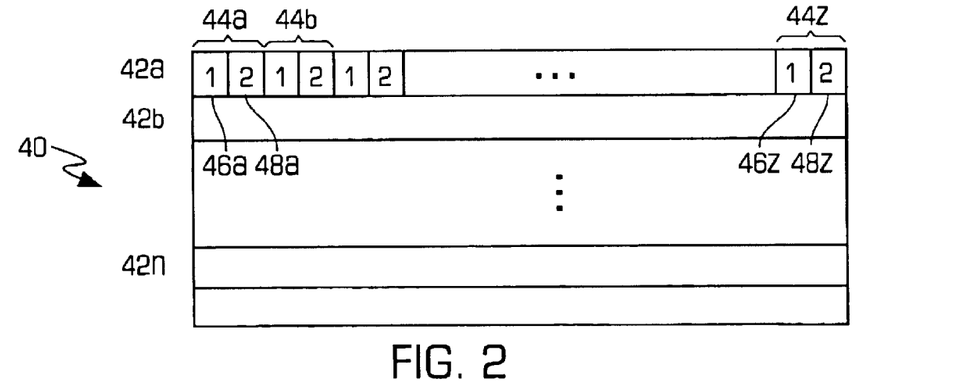
FIG. 2 is a schematic diagram of one embodiment of the memory array shown in FIG. 1.

Referring to FIG. 2, there is shown one embodiment of the memory array 40. The memory array 40 is further divided into a plurality of memory units 44 (A–Z) which are arranged also in a plurality of rows, such as 42 (A–N) and a plurality of columns. Each of the memory units 44 comprises a plurality of memory cells 46 and 48. Each of the memory cells 46 and 48, as previously discussed, stores a multibit state. In the embodiment shown in FIG. 2, two memory cells 46 and 48 comprise a memory unit 44. Further, the memory cells 46 and 48 are adjacent to one another and are contiguous.

Figure 3:
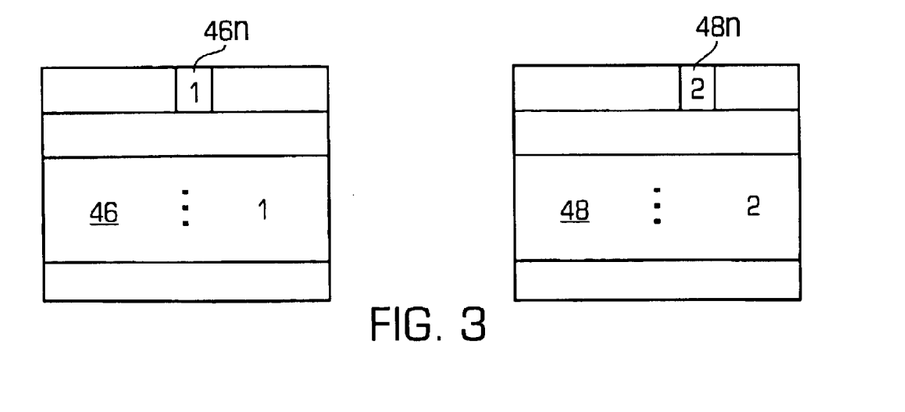
FIG. 3 is a schematic diagram of another embodiment of the memory array shown in FIG. 1.

Referring to FIG. 3, there is shown another embodiment of the memory array 40. In this embodiment, the memory array 40 comprises a first subarray of memory cells 46 and a second subarray of memory cells 48. The memory cells 46 and 48 collectively are contiguous. However, the corresponding memory cell 46N and 48N of a particular memory unit 44 N are spaced apart.

In either of the embodiments of the memory array 40 shown in FIG. 2 or FIG. 3, in one preferred embodiment, the memory array 40 is divided into a plurality of sectors with each sector having a plurality of memory units 44 which are all erasable together. In one particular embodiment, one sector is one row of memory units. Clearly, a sector can comprise a plurality of rows or a portion of a row. Further, the number of memory units 44 within each sector is user definable.

Figures 4, 5:
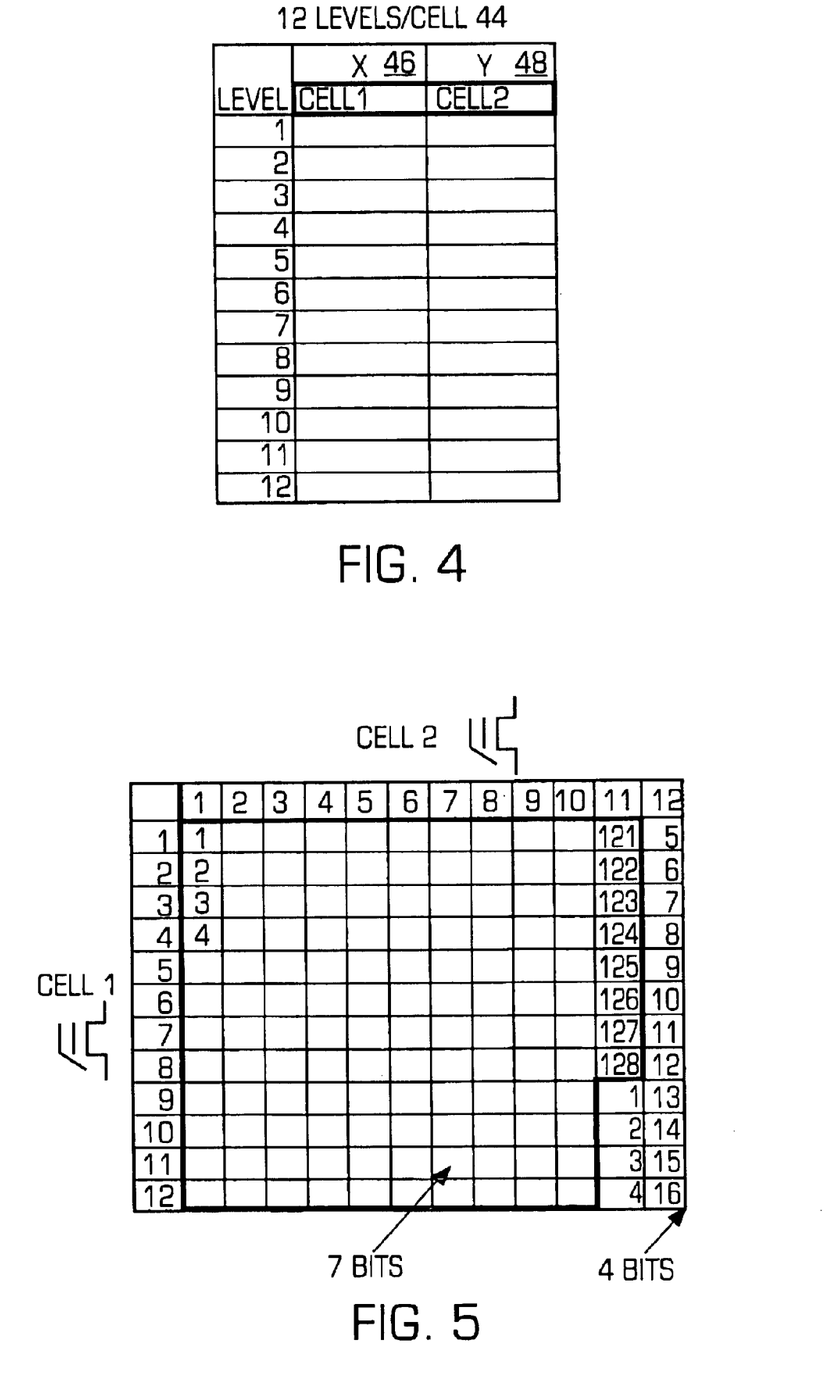
FIG. 4 is a chart of one embodiment of the integrated multilevel nonvolatile memory circuit of the present invention in which a memory unit comprises two memory cells with each memory cell have 12 levels of storage.
FIG. 5 is a chart showing one embodiment of the partitioning of the user data and overhead data in the embodiment of the memory cells shown in FIG. 4.

Referring to FIG. 4, there is shown a chart of an example of the device 10 of the present invention using memory cells 46 and 48, each having the capacity to store 12 different levels or states. FIG. 4 also assumes that the memory unit 44 used in the device 10 has two cells. As can be seen from FIG. 4, a first memory cell 46, designated as "cell 1" has the capacity to store 12 states and a second memory cell 48 of the memory unit 44, designated as "cell 2" has also the capacity to store 12 states.

Referring to FIG. 5, there is shown a chart showing the partitioning of user data and overhead data in the memory unit 44 shown in FIG. 4. Because each of the memory cells 46 ("cell 1") and 48 ("cell 2") has the capacity to store 12 different states, the total number of combination of states that the unit 44 can store is 144 (12×12). One example of the separation of the user data and the overhead data, as shown in FIG. 5 is that the user data comprises 128 states for a seven-bit encoding with the overhead data comprising the remaining 16 states for a four-bit encoded data. Thus, for all possibilities of cell 1 in states 1–12 and cell 2 being in states 1–10, all that would be user data. Further, the user data would comprise the combination of cell 2 being in state 11 with cell 1 being in states 1–8. This comprises a total of 128 states. For the combination of cell 1 being in states 9–12 and cell 2 being in state 11 and cell 2 being in state 12 and cell 1 being in states 1–12, that would be the overhead data portion. In the event the memory unit 44 is mapped in accordance with the foregoing, then as can be seen, every memory unit 44 would have a predetermined virtual partition of seven bits of encoded user data and four bits of encoded overhead data. The "demarcation" between the user data and the overhead data would occur at the state where cell 2 is in state 11 and cell 1 is in states 8 and 9.

Figure 6:
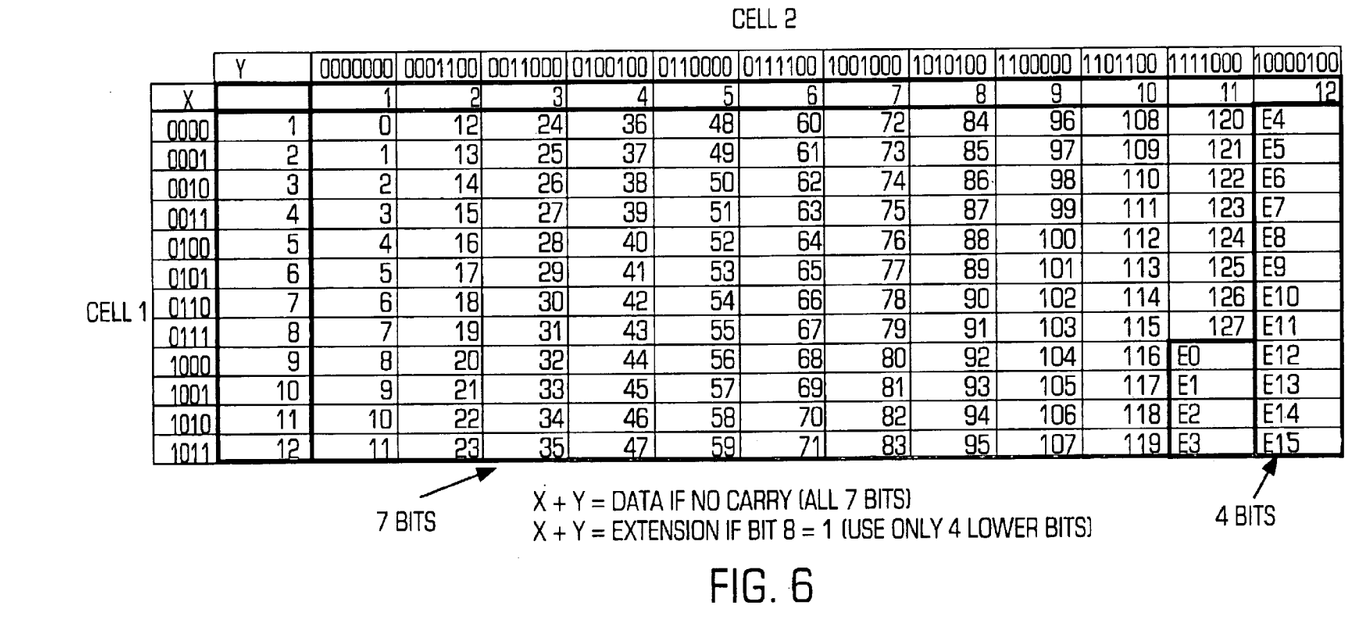
FIG. 6 is a chart of the embodiment of the encoding of user data and overhead data of the memory unit shown in FIG. 4.

Referring to FIG. 6, there is shown a chart of a scheme for the encoding and virtual mapping of user data and overhead data within a memory unit 44 comprising of a memory cell 46 ("cell 1") and a memory cell 48 ("cell 2"). Again, identical to the division of the user data and the overhead data shown in FIG. 5, the user data comprises seven bits or 128 states and the overhead data comprises four bits or 16 state. In particular, for the memory cell 46, the 12 states are encoded in the conventional four-bit encoding manner, i.e.,

| State | Bit Pattern |
|---|---|
| 1 | 0000 |
| 2 | 0001 |
| 3 | 0010 |
| 4 | 0011 |
| 5 | 0100 |
| 6 | 0101 |
| 7 | 0110 |
| 8 | 0111 |
| 9 | 1000 |
| 10 | 1001 |
| 11 | 1010 |
| 12 | 1011 |

However, for the 12 states for cell 2 or memory cell 48, the states are encoded in a seven-bit pattern as follows:

| State | Bit Pattern |
|---|---|
| 1 | 0000000 |
| 2 | 0001100 |
| 3 | 0011000 |
| 4 | 0100100 |
| 5 | 0110000 |
| 6 | 0111100 |
| 7 | 1001000 |
| 8 | 1010100 |
| 9 | 1100000 |
| 10 | 1101100 |
| 11 | 1111000 |
| 12 | 1000100 |

Figure 7:
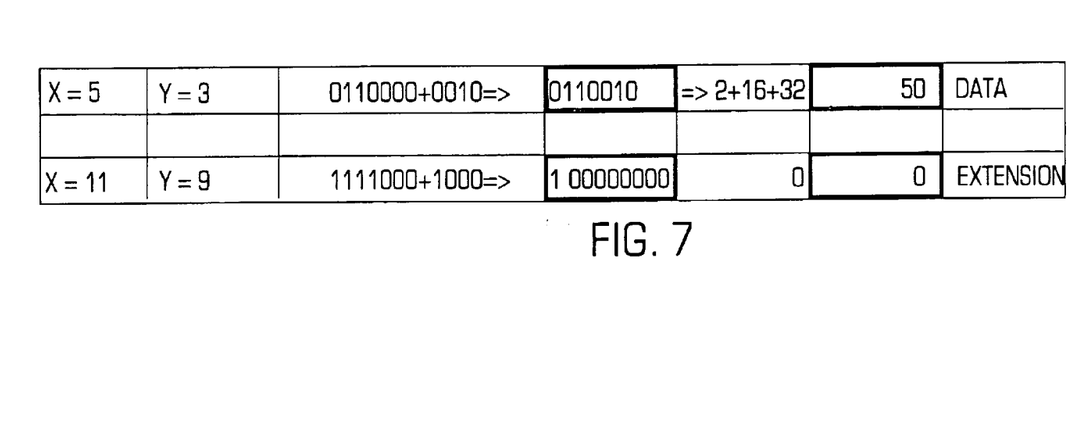
FIG. 7 is a chart showing an example of the encoding of user data and overhead data in the memory unit shown in FIG. 6.

When a memory cell 48 is read out and one of the 12 states is determined, it is assigned to one of the foregoing seven-bit strings. The addition of the seven-bit string representative of the state of memory cell 48 with the four-bit string representative of the state of the memory cell 46, results in a binary string which is either seven bits or seven bits with a carry to eight bits. If the resultant addition is a seven-bit data string, then that data string is representative of user data. If the resultant addition is eight bits, then the lower four significant bits are used as the overhead data. Thus, through the simple addition of the bits representative of memory cell 46 and the bits representative of memory cell 48 a fast way to determine the demarcation between user data and overhead data results. This can be seen by way of an example which is shown in FIG. 7. If the state of memory cell 46 is level 3 which has a bit string of "0010" and the state of memory cell 48 has a level 5 which has a bit string of "011000", then the addition of these two bit strings results in "0110010" which is a number of "50 ". This is user data since only seven bits result. However, if the state of memory cell 46 is a level 9 having a bit string of "1000" and the state of memory cell 48 has a bit state of level 11 having a bit string of "1111000", the addition of these two bit strings results in "10000000", which is an eight-bit string indicating that this is overhead data and having a value as determined in the lower four bits of "0000".

Figure 8:
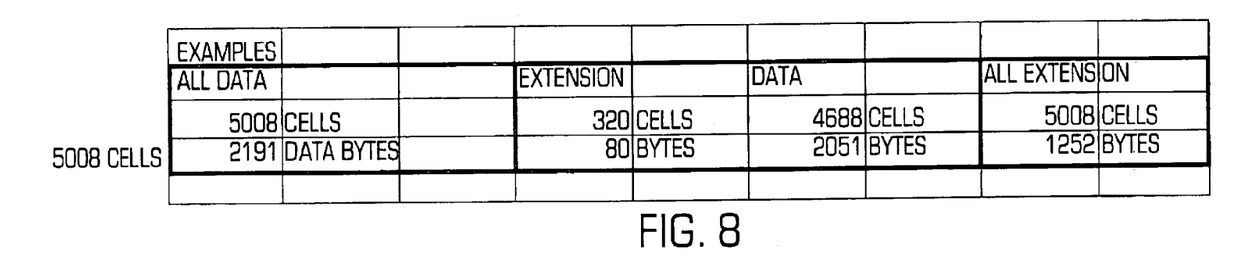
FIG. 8 is a chart of different page size examples for the memory unit example shown in FIG. 4.

Referring to FIG. 8, there is shown examples of three different partitions. Of course, only one example can be implemented at a time within the memory 40. As shown in FIG. 2, a single row 42 of cells 44 can be used to define a page that can be partitioned into user data and overhead data. FIG. 8 shows the cases of 1) all data, 2) partial data and overhead data and 3) all overhead data. For the case of all data, for a row consisting of 5008 cells, an all data partition would consist of 2191 Bytes (5008 cells/2 cells/unit*7 bits/unit/8 bit/byte). For the case of partial data and overhead data, for a partition of 320 cells for data overhead and 4688 cells for data, the data overhead partition would consist of 80 Bytes while the data would consist of 2051 Bytes. In typical media applications, the overhead is 48 bytes for every 2048 bytes for a very small percentage of the overall memory. For the third case, all 5008 cells partitioned as data overhead represents 1252 Bytes. As a result, writing specific states to the memory units can form several combinations of partitions. Also, multiple data and data overhead partitions can be combined on a single row. This allows the user to change the partition sizes locally so that the data structures can scale in size to match system requirements thereby providing greater memory storage density. The encoding of the states into partitions requires no separate partition tables thereby providing additional memory capacity for data storage.

Figure 9:
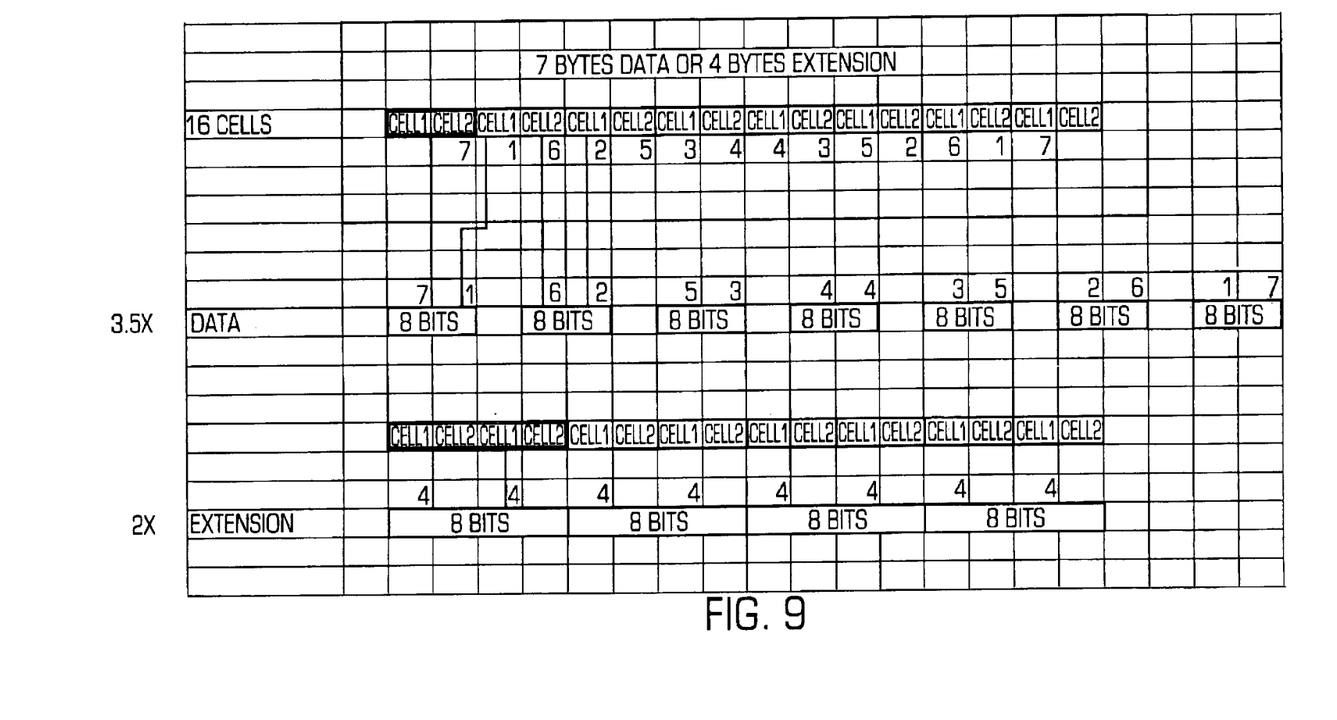
FIG. 9 is a chart showing the logical architecture for a memory unit example shown in FIG. 4.

FIG. 9 is a graph showing the mapping of the example of memory cells 46 and 48 of a memory unit 44 having 12 levels to a conventional eight-bit byte system. In particular, since most data is stored an eight-bit byte, if a memory cell 46 and 48 of a memory unit 44 contained a seven-bit user data, that must be converted to an eight-bit byte. As shown in FIG. 9, eight memory units 44 each having a memory cell 46 and a second memory cell 48 of 12 levels each, contains seven bits of user data. The seven bits of user data from each of the 16 memory units 44 can be mapped to seven bytes of eight bits of user data. Further, the four bits of overhead data in each of the 16 memory units will be mapped into four eight-bit bytes of overhead data.

Figure 10:
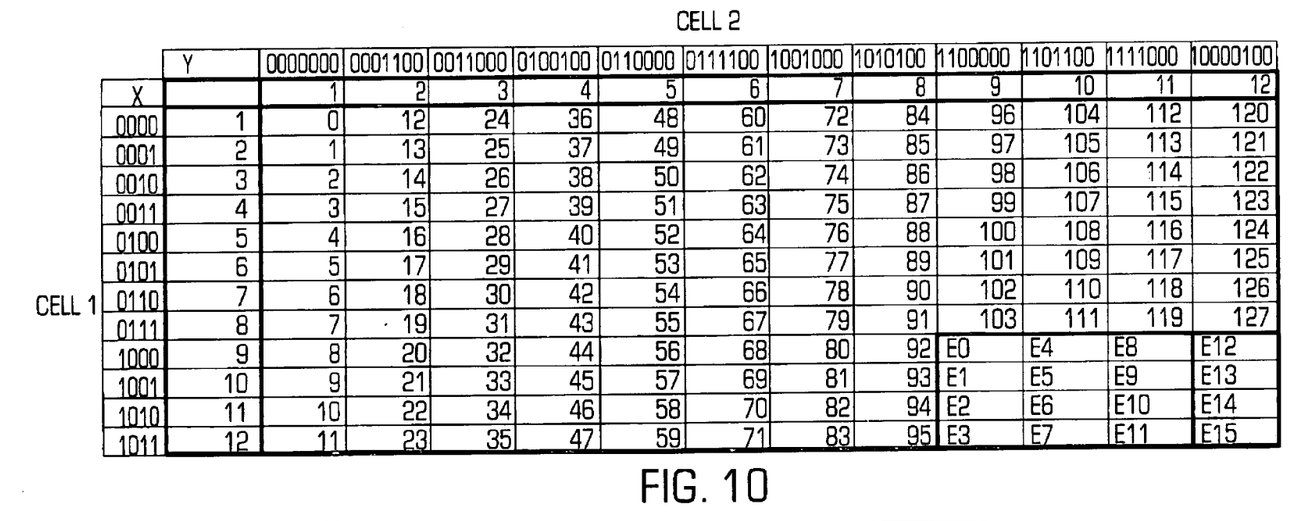
FIG. 10 is an example of another embodiment of encoding of the user data and the overhead data in the example of the memory unit shown in FIG. 4.
Figure 11:
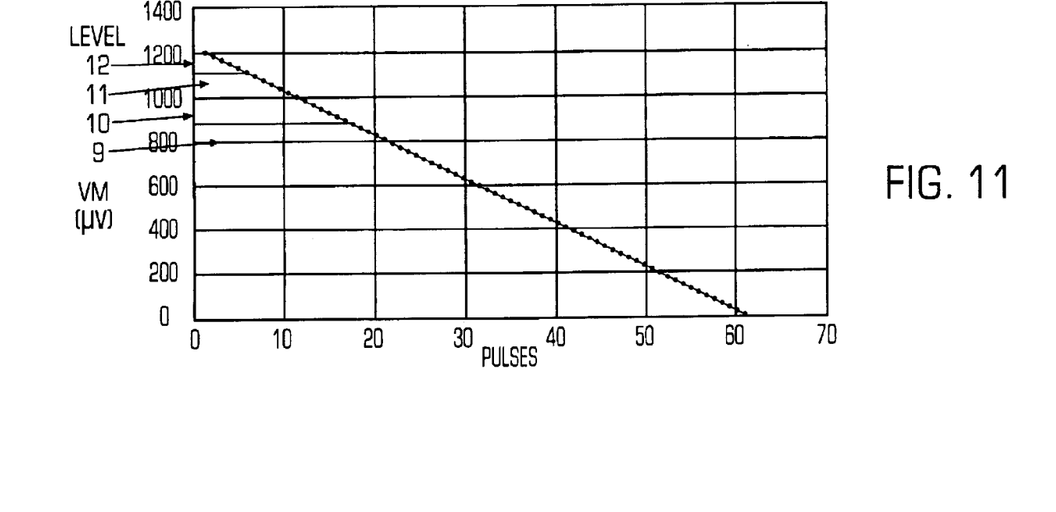
FIG. 11 is a chart showing the voltages used in programming the overhead data in the example shown in FIG. 10.

Referring to FIG. 10, there is shown another chart showing the partitioning between user data and overhead data in a twelve state memory cell 46 and 48 in a memory unit 44. In this example shown in FIG. 10, the user data comprises all the states when memory cell 46 is in states 1–12 and memory cell 48 is in states 1–8. This constitutes 96 possible states. Further, the user data is encoded and stored when the memory cell 48 is in states 9–12 and memory cell 46 is in states 1–8. This constitutes another 32 states, thereby giving a total of 128 user data states for a seven-bit encoded user data. The overhead data is stored in the encoded levels when memory cell 48 is in states 9–12 and memory cell 46 is in states 9–12. The advantage of encoding user data and overhead data in this manner is it provides faster programming for the overhead data. This can be seen by reference to FIG. 11. FIG. 11 shows the number of pulses required to program a memory cell, 46 or 48, into one of its 12 levels. For level 12, the number of pulse is zero or is minimal. For the level of 11, the number of pulses is the least amount. Since the overhead data is stored in states of memory cell 46 and 48 of between levels 9 and 12, this requires the least number of pulses to program both memory cells 46 and 48 into those states. This results in faster programming since this is the least number of program pulses that must be applied.

Figure 12:
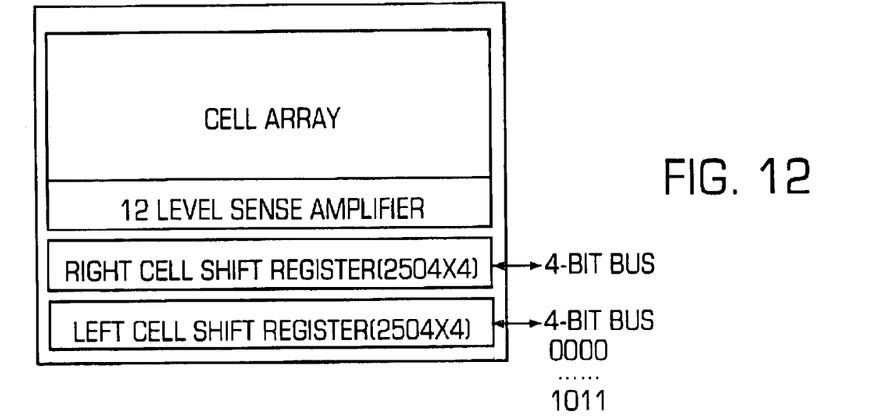
FIG. 12 is an external map architecture example of a portion of the memory circuit shown in FIG. 1.

Referring to FIG. 12, there is shown an external map architecture of an example of the memory array 40. In this architecture, the partition encoding and decoding is performed at the system level. The flash memory 10 transfers the memory units 44 between a buffer and the memory array 40. Each memory cell 46 or 48 must use 4-bits to represent 12 states of information; and therefore, a memory unit 44 comprises two groups of 4-bits. The buffer can be constructed as left and right 4-bit shift registers that can be combined to form an external 8-bit bus. By combing multiple 4-bit groups, larger bus sizes can be selected for greater data throughput. As shown in FIG. 6, the partition encoding and decoding by a system controller can be performed. The logical operations as shown in FIG. 9 are performed by a system controller are used to reconstruct the partitions into multiples of Bytes. The partition sizes and location can be defined or redefined at any time by a system controller. This method is most useful for achieving smaller flash memory die sizes resulting in lower memory costs.

Figure 13:
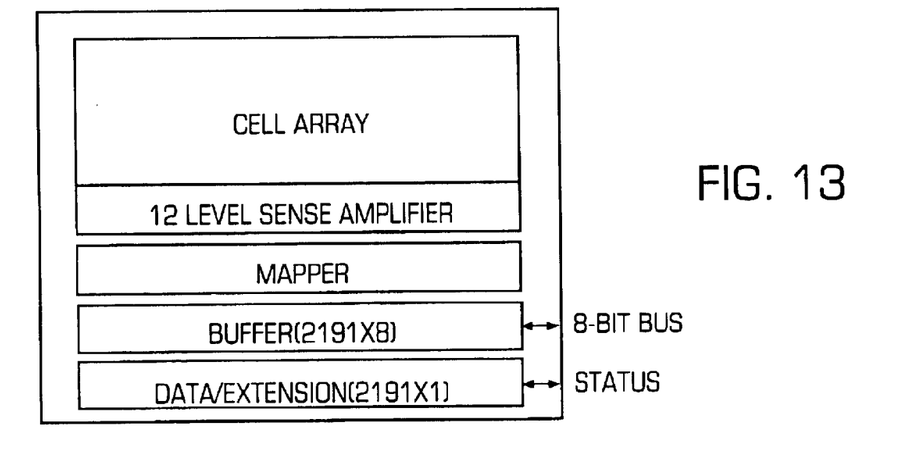
FIG. 13 is an internal mapped architecture of the portion of the memory circuit shown in FIG. 1.

Referring to FIG. 13, there is a schematic diagram of an internal map architecture of an example of a memory array 40. The partitioning and logical byte reconstruction operations required by the external map architecture can be self contained in the flash memory 10. The mapping is performed between the buffer and the memory array 40. This allows the buffer to represent data and data overhead in normal byte form. FIG. 13 shows the case where data and data overhead are mapped into a 2191 byte buffer. Along with the buffer information, a status bit 2191×1 register is available to indicate whether the 8-bit bus is data or data overhead. Again, the partitions can be defined or redefined at any time by a system controller. This method is most useful to achieve higher read and write performances at the expense of larger flash memory die sizes resulting in higher flash memory costs.

Figure 14:
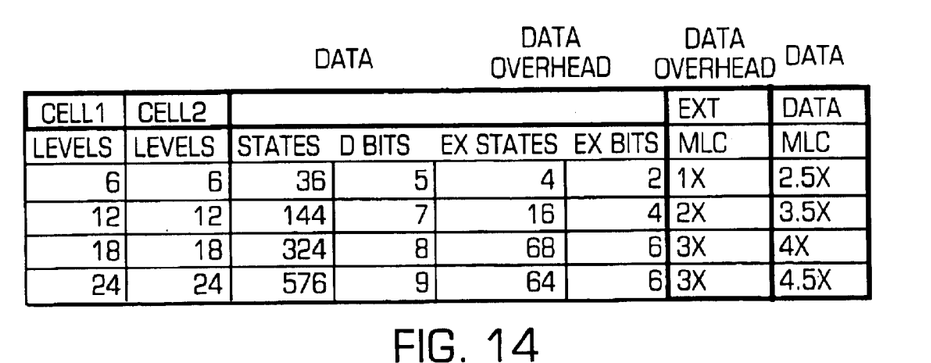
FIG. 14 is a chart showing examples of other memory units having memory cells with other multilevels which can be used with the present invention.

Referring to FIG. 14, there is a chart showing the present invention used with memory cells having a number of levels of state of storage other than 12. For example, as shown in FIG. 14, if memory cell 1 and memory cell 2 of a memory unit each had six levels of storage, then it is possible to partition a memory unit into five bits of user data with two bits of overhead data in that memory unit. In that event, the data overhead is stored as 1×(1-bit per cell) and data is stored at 2.5×(2.5 bits/cell). Similarly, as shown in FIG. 14, if each of the memory cell 1 and memory cell 2 had 12 levels of state of storage, then it is possible to encode 144 possible states and partitioning them into seven bits of encoded user data with four bits of overhead data all as described heretofore. In that event, the data overhead is stored as 2×(2-bits per cell) and data is stored at 3.5×(3.5 bits/cell). It is also possible with the present invention to employ cell 1 and cell 2 each with 18 levels of storage resulting in a memory unit having 324 possible combination states with a partitioning of eight bits of user data and six bits of overhead data. In that event, the data overhead is stored as 3×(3-bits per cell) and data is stored at 4×(4 bits/cell). Finally, the present invention may also be used with memory cell 1 and memory cell 2 each having 24 possible states for a total possible combination of 576 states partitioned into nine bits of user data and six bits of overhead data. In that event, the data overhead is stored as 3×(3-bits per cell) and data is stored at 4.5×(4.5 bits/cell).

From the foregoing, it can be seen that an integrated multilevel nonvolatile memory circuit in which a memory unit comprising a plurality of memory cells each for storing a multibit state is shown with the memory unit storing encoded user data and overhead data which are virtually partitioned. Thus, the advantage of the present invention is that 1) the partition table information is encoded into the states eliminating the need for a dedicated table memory space and (2) the data and overhead byte lengths can be variable. As a result, this allows for a greater packing density for a given physical memory size constraint. The best efficiency is achieved when the overhead bytes are small relative to the data bytes.

What is claimed is:

1. An integrated multilevel non-volatile memory circuit comprising:

a plurality of memory units arranged in an array comprising a plurality of rows and columns; and each of said memory units having a plurality of memory cells, with each cell storing a plurality (greater than 2) of states;

wherein each of said memory units stores encoded user data and overhead data that are virtually partitioned.

2. The circuit of claim 1 wherein the plurality of memory cells of each memory unit are contiguous.

3. The circuit of claim 1 wherein the plurality of memory cells of each memory unit are spaced apart.

4. The circuit of claim 1 wherein said memory circuit comprises a plurality of sectors with each sector having a plurality of memory units and being erasable together.

5. The circuit of claim 4 wherein the member of memory units in each sector is user definable.

6. The circuit of claim 4 wherein each cell of a unit provides storage for twelve states with each memory unit for providing storage of 128 states of user data and 16 states of overhead data.

7. A method of storing user data and overhead data in a non-volatile memory circuit, said method comprising:

partitioning an array of semiconductor memory cells into a plurality of memory units with each memory unit having a plurality of memory cells; and storing a plurality (greater than 2) of states in each memory cell of each memory unit;

wherein each memory unit stores encoded user data and overhead data that are virtually partitioned.

8. The method claim 7 wherein said partitioning step further comprising:

partitioning said array of semiconductor memory cells into a plurality of sectors with each sector having a plurality of memory units, with each memory unit having a plurality of memory cells;

wherein the memory units of a sector are erased together.

9. The method of claim 8, wherein the number of memory units in each sector is user definable.

10. The method of claim 8 wherein the plurality of memory cells of each memory unit are contiguous.

11. The method of claim 8 wherein the plurality of memory cells of each memory unit are spaced apart.

* * * * *